US010052863B2

(12) United States Patent
Wang et al.

(10) Patent No.: US 10,052,863 B2
(45) Date of Patent: Aug. 21, 2018

(54) PRINTING SCREEN AND SEALANT PRINTING METHOD

(71) Applicants: BOE TECHNOLOGY GROUP CO., LTD., Beijing (CN); ORDOS YUANSHENG OPTOELECTRONICS CO., LTD., Ordos, Inner Mongolia (CN)

(72) Inventors: Xuansheng Wang, Beijing (CN); Fujiang Jin, Beijing (CN); Fuyi Cui, Beijing (CN)

(73) Assignees: BOE TECHNOLOGY GROUP CO., LTD., Beijing (CN); ORDOS YUANSHENG OPTOELECTRONICS CO., LTD., Ordos, Inner Mongolia (CN)

( * ) Notice: Subject to any disclaimer, the term of this patent is extended or adjusted under 35 U.S.C. 154(b) by 0 days.

(21) Appl. No.: 15/517,053

(22) PCT Filed: Jan. 25, 2016

(86) PCT No.: PCT/CN2016/072011

§ 371 (c)(1),
(2) Date: Apr. 5, 2017

(87) PCT Pub. No.: WO2017/049822

PCT Pub. Date: Mar. 30, 2017

(65) Prior Publication Data

US 2017/0297324 A1 Oct. 19, 2017

(30) Foreign Application Priority Data

Sep. 24, 2015 (CN) .......................... 2015 1 0618106

(51) Int. Cl.
*B41N 1/24* (2006.01)
*B41F 15/36* (2006.01)
(Continued)

(52) U.S. Cl.
CPC ................ *B41F 15/36* (2013.01); *B41C 1/14* (2013.01); *B41N 1/248* (2013.01); *H01L 51/56* (2013.01)

(58) Field of Classification Search
CPC ........... B41F 15/36; B41C 1/14; B41N 1/248; H01L 51/56
See application file for complete search history.

(56) References Cited

U.S. PATENT DOCUMENTS 8,791,474 B1 7/2014 Bibl et al.
8,968,509 B2 * 3/2015 Gottmann ........... H01M 8/0286 156/277
(Continued)

FOREIGN PATENT DOCUMENTS

CN 203713223 U 7/2014
CN 104409662 A 3/2015
(Continued)

OTHER PUBLICATIONS

International Search Report and Written Opinion dated Jun. 7, 2016; PCT/CN2016/072011.

*Primary Examiner* — Matthew G Marini
*Assistant Examiner* — Marissa Ferguson Samreth
(74) *Attorney, Agent, or Firm* — Ladas & Parry LLP

(57) ABSTRACT

A printing screen and a sealant printing method are provided. The printing screen includes a frame, a mesh/screen fixed on the frame, and a film formed on the mesh. The portion of the mesh that is not covered by the film forms a feeding port in a rectangular ring shape. The rectangular ring includes two opposite first sides and two opposite second sides. The width of an upper opening of the cross section across the first sides is less than or equal to that of an upper opening of the cross section across the second sides. At a first height, the area of the cross section across the first sides is greater than that of the cross section across the second
(Continued)

(a) (b)

sides, the first height being less than the thickness of the film. The printing screen and the sealant printing method solve the problem of poor height uniformity of sealants.

16 Claims, 5 Drawing Sheets

(51) Int. Cl.
*B41C 1/14* (2006.01)
*H01L 51/56* (2006.01)

(56) References Cited

U.S. PATENT DOCUMENTS

| | | | | |
|---|---|---|---|---|
| 2016/0329528 | A1* | 11/2016 | Sun | H01L 51/56 |
| 2017/0044663 | A1* | 2/2017 | Bai | B41J 2/005 |

FOREIGN PATENT DOCUMENTS

| | | | | | |
|---|---|---|---|---|---|
| CN | 104417025 | A | | 3/2015 | |
| CN | 105172324 | A | | 12/2015 | |
| JP | 2001-047760 | A | | 2/2001 | |
| JP | 2001-219535 | | * | 8/2001 | B41F 15/12 |
| JP | 2008-221697 | | * | 9/2008 | B41N 1/24 |
| WO | 2012/025847 | A1 | | 3/2012 | |

* cited by examiner

PRINTING SCREEN AND SEALANT PRINTING METHOD

TECHNICAL FIELD

Embodiments of the present disclosure relate to a screen printing plate and a sealant printing method.

BACKGROUND

A current display generally includes an upper substrate and a lower substrate which are adhered by sealant in a packaging region. The sealant is formed on the upper substrate or the lower substrate by printing it using a screen printing plate, and the upper substrate and the lower substrate are assembled correspondingly and adhered together.

SUMMARY

Embodiments of the present disclosure provide a screen printing plate and a sealant printing method. Printing by using the screen printing plate can improve height uniformity of printed patterns.

Embodiments of the present disclosure employ technical solutions below.

Embodiments of the present disclosure provides a screen printing plate, including: a screen frame, a screen fixed to the screen frame and a film formed on the screen, a portion of the screen that is not covered by the film forming a feed opening in a shape of a rectangle ring. The rectangle ring includes two opposite first sides and two opposite second sides; a width of an upper-opening of a cross section of the first side is less than or equal to that of the second side; and at a first height, an area of the cross section of the first side is greater than that of the second side, the first height being less than a thickness of the film.

In an example, the cross section of the first side is a regular trapezoid and the cross section of the second side is an inverse trapezoid.

In an example, the width of the upper-opening of the cross section of the first side is equal to a width of a lower-opening of the cross section of the second side, and a width of a lower-opening of the cross section of the first side is equal to the width of the upper-opening of the cross section of the second side.

In an example, in a case where the width of the upper-opening of the cross section of the first side is equal to the width of the upper-opening of the cross section of the second side, the cross section of the first side is a regular trapezoid, and the cross section of the second side is a rectangular, or the cross section of the first side is a rectangular, and the cross section of the second side is an inverse trapezoid.

In an example, the trapezoid is an isosceles trapezoid.

In an example, in a case where the cross section of the first side is a regular trapezoid and the cross section of the second side is a rectangular, an included angle formed by a waist side of the regular trapezoid and a lower base of the regular trapezoid is in a range from 2° to 19°.

In an example, at least one side edge of the cross section of the first side is ladder-shaped; and/or at least one side edge of the cross section of the second side is ladder-shaped.

In an example, two side edges of the cross section of the first side are symmetrically ladder-shaped; and/or two side edges of the cross section of the second side are symmetrically ladder-shaped.

Embodiments of the present disclosure also provides a sealant printing method, including: corresponding a feed opening of the screen printing plate to a packaging region on a substrate to be printed; placing sealant at the feed opening of the screen printing plate; coating the sealant by using a squeegee ill a direction parallel to the second side in a single pass; and separating the screen printing plate from the substrate to be printed.

BRIEF DESCRIPTION OF TILE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, a person of ordinary skill in the art can obtain other embodiment(s), without any creative work, which shall be within the scope of the present disclosure.

Unless otherwise defined, all the technical and scientific terms used herein have the same meanings as commonly understood by a person of ordinary skill in the art to which the present disclosure belongs. The terms, such as "first," "second," or the like, which are used in the description and the claims of the present disclosure, are not intended to indicate any sequence, amount or importance, but for distinguishing various components. Also, the terms, such as "a," "an," "the," or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, “on,” “under,” or the like are only used to indicate relative position relationship, and when the position of the object which is described is changed, the relative position relationship may be changed accordingly.

Figure 1:
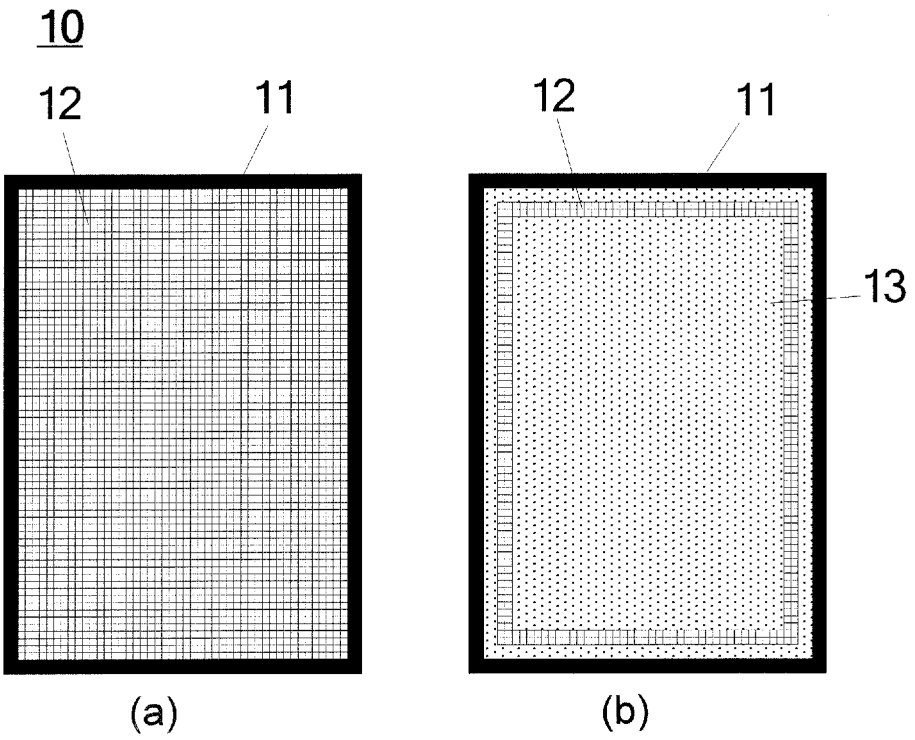
FIG. 1 is a schematic diagram of manufacturing a screen printing plate.

A screen printing plate 10 is made as shown in FIG. 1. Firstly, a screen 12 is fixed to a screen frame 11 as shown in FIG. 1(*a*); then, a film 13 is formed on the screen. The film 13 is partially removed after being exposed. A sealant screen printing plate is shown in FIG. 1(*b*), a portion of the film not covering the screen forms a pattern of a “rectangle ring” shape, and a cross section of the rectangle ring is of the same shape, generally a rectangle. Printing sealant on a substrate aims to aligning a screen printing plate with a substrate precisely so that the region (i.e., the rectangle ring) not covered by the film on the screen printing plate corresponds to a position of a packaging region of the substrate. Sealant is placed on the screen printing plate, as illustrated in FIG. 2, a squeegee 20 is used to apply pressure on and coat the screen printing plate, and as illustrated in FIG. 3, sealant 31 is transferred via the screen onto the packaging region of a substrate 30 on the portion of the screen printing plate not covered by the film.

Figure 2:
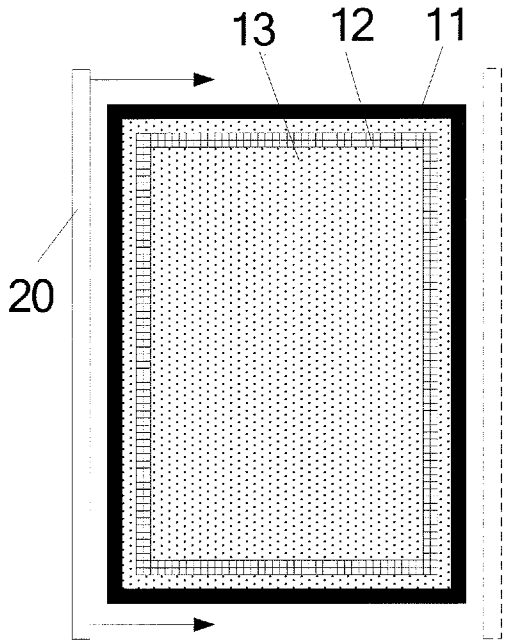
FIG. 2 is a schematic diagram of printing sealant by using a screen printing plate.
Figure 3:
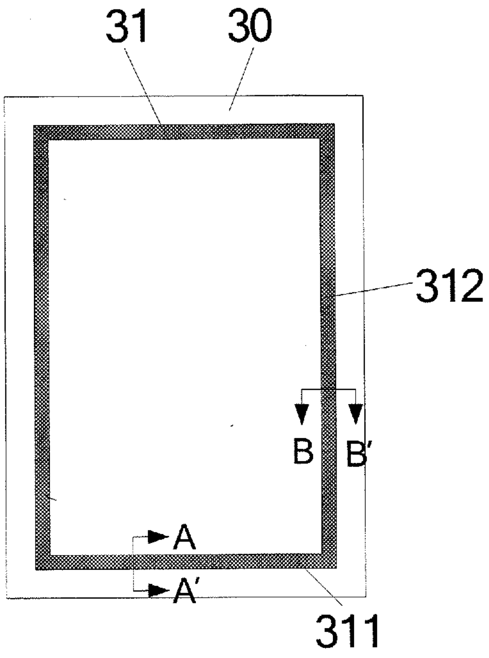
FIG. 3 is a schematic diagram of sealant formed by printing on a substrate using a screen printing plate.
Figure 4:
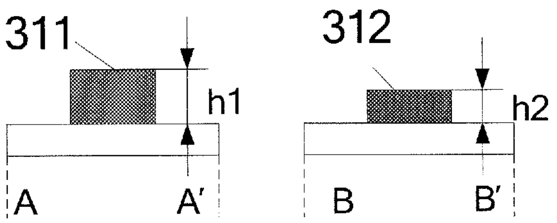
FIG. 4 is a schematic diagram of a cross section of the sealant illustrated in FIG. 3.

Inventors notice that when the squeegee 20 moves in a single pass from one side to the other side of the screen printing plate in a direction of the arrow shown in FIG. 2, a second sealant 312 perpendicular to the moving direction of the squeegee 20 bears greater pressure from the squeegee, and as illustrated by FIG. 4, the formed second sealant 312 is lower or thinner; a first sealant 311 parallel to the moving direction of the squeegee 20 bears less pressure from the squeegee and the formed first sealant 311 is higher or thicker, i.e., h1>h2. As a result, the height uniformity of the sealant is poor, which compromises the packaging effect of the substrate.

Figure 5:
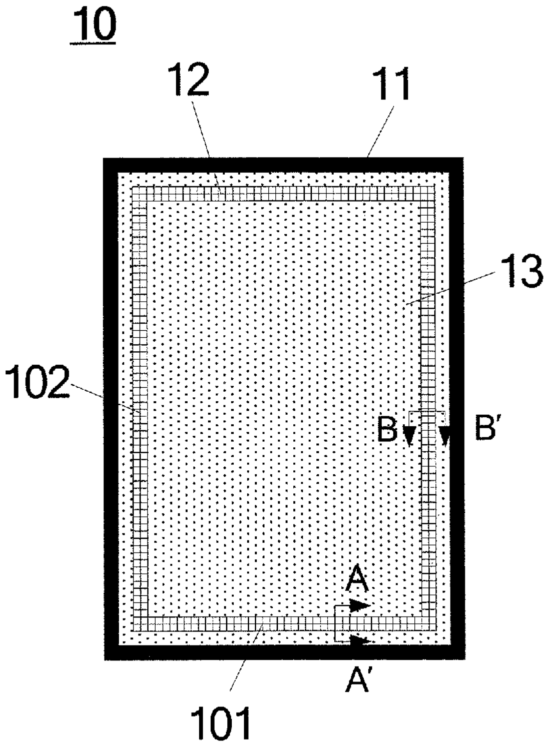
FIG. 5 is a schematic diagram of a screen printing plate provided by an embodiment of the present disclosure.

An embodiment of the present disclosure provides a screen printing plate 10, as illustrated by FIG. 5, including: a screen frame 11, a screen 12 fixed to the screen frame 11 and a film 13 formed on the screen 12, a portion of the screen 12 that is not covered by the film 13 forming a feed opening of a rectangle ring shape. The rectangle ring includes two opposite first sides 101 and two opposite second sides 102. A width of an upper-opening of a cross section of the first side 101 is less than or equal to a width of an upper-opening of a cross section of the second side 102; and at a first height, an area of the cross section of the first side 101 is greater than an area of the cross section of the second side 102. The first height is less than a thickness of the film.

It is noted that in the embodiment of the present disclosure, a portion defined between two rectangles whose symmetric centers coincide and four sides respectively parallel to each other is called a “rectangle ring”. A screen is composed by a plurality of mesh lines that are weaved together, and the drawings are illustrated by taking the screen 12 being a tabular as an example.

Figure 6:
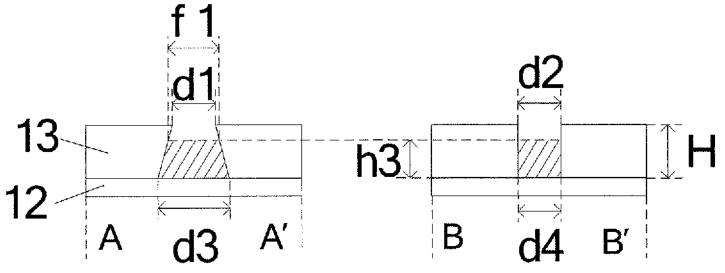
FIG. 6 is a schematic diagram of cross sections of a first side and a second side of another screen printing plate provided by an embodiment of the present disclosure.

As illustrated by FIG. 6, the width of the upper-opening of the cross section (A-A') of the first side 101 is equal to the width of the upper-opening of the cross section (B-B') of the second side 102, i.e., d1=d2. At a first height h3, an area S1 of the cross section (A-A') of the first side, i.e., an area of the shadow trapezoid in FIG. 6, satisfies an equation: S1=(d3+f1)×h3÷2, where d3 is a lower base of the shadow trapezoid, f1 is an upper base of the shadow trapezoid, and h3 is the height of the shadow trapezoid. At the first height h3, an area S2 of the cross section (B-B') of the second side, i.e., an area of the shadow rectangle in FIG. 6, satisfies an equation: S2=d4×h3, where d4 is a length of the shadow rectangle, and h3 is a height of the shadow rectangle. Because d1=d2, d2=d4, and f1>d1, then d3>d4, f1>d4, and (d3+f1)÷2>d4, i.e., S1>S2, where the first height h3 is less than a thickness H of the film.

Figure 7:
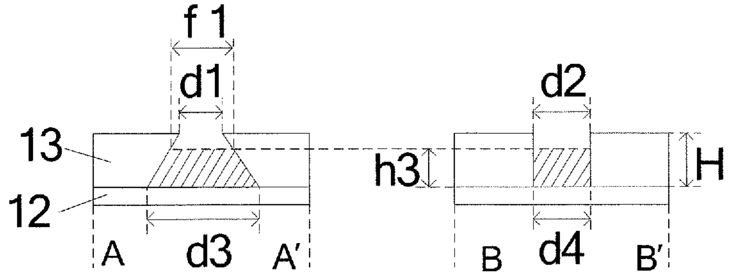
FIG. 7 is a schematic diagram of cross sections of a first side and a second side of yet another screen printing plate provided by an embodiment of the present disclosure.

As illustrated by FIG. 7, the width of the upper-opening of the cross section (A-A') of the first side 101 is less than the width of the upper-opening of the cross section (B-B') of the second side 102, i.e., d1<d2. An area S1 of the cross section (A-A') of the first side, i.e., an area of the shadow trapezoid in FIG. 7, satisfies an equation: S1=(d3+f1)×h3÷2, where d3 is a lower base of the shadow trapezoid, f1 is an upper base of the shadow trapezoid, and h3 is a height of the shadow trapezoid. At the first height h3, an area S2 of the cross section (B-B') of the second side, i.e., an area of the shadow rectangle in FIG. 7, satisfies an equation: S2=d4×h3, where d4 is a length of the shadow rectangle, and h3 is a height of the shadow rectangle. To allow S1>S2, then (d3+f1)÷2>d4.

The cross sections of the first side and second side are not limited to the ways illustrated by FIGS. 6 and 7. The above are merely exemplary explanations, and one of ordinary skill in the art can also contemplate other ways.

In the embodiment of the present disclosure, azimuth terms such as “upper,” “lower,” or the like are defined based on the azimuth showed by the screen printing plate in the drawings. It is to be understood that these directional technical terms are relative concepts, which are used for relative description and clarification and can be changed correspondingly in accordance with the changes in azimuth of the placement of the screen printing plate.

For the screen printing plate provided by the embodiment of the present disclosure, in one aspect, in a case where the width of the upper-opening of the cross section of the first side is less than the width of the upper-opening of the cross section of the second side, the feed opening of the first side is less than the feed opening of the second side, which is advantageous for reducing feed quantity of the first side; in another aspect, at the first height, the area of the cross section of the first side is greater than the area of the cross section of the second side, that is, in a case where the areas of the cross sections are equal to each other, the height of the first side is less than that of the second side.

Embodiments of the present disclosure will be described in details to illustrate how the present screen printing plate can increase the uniformity of sealant by combining the use of the screen printing plate to print sealant.

An embodiment of the present disclosure provides a sealant printing method, including the following steps.

Corresponding the feed opening of the screen printing plate provided by an embodiment of the present disclosure to a packaging region on a substrate to be printed; placing sealant at the feed opening of the screen printing plate; being parallel to the second side, the squeegee passing the two second sides in sequence to coat the sealant; and separating the screen printing plate from the substrate to be printed.

It is noted that due to being parallel to the second side, the squeegee passes the two second sides in sequence to coat the sealant, and thus the sealant on the second side bears greater pressure from the squeegee than the sealant on the first side. In a case where the width of the upper-opening of the cross section of the first side is equal to the width of the upper-opening of the cross section of the second side, and since at the first height, the area of the cross section of the first side is greater than the area of the cross section of the second side, in one aspect, in a case where the areas are equal, the height of the cross section of the first side is less than the height of the cross section of the second side; in another aspect, the sealant on the first side bears greater pressure from the squeegee than the sealant on the second side. By the two factors, the disclosure as compared with the prior art can reduce the height of the sealant on the second side, so that the heights of sealants formed on the first side and the second side can be approximately equal to each other. Or, in a case where the width of the upper-opening of the cross section of the first side is less than the width of the upper-opening of the cross section of the section side, the feed quantity of the sealant on the first side is reduced in yet another aspect. By the three factors, the disclosure as compared with the prior art can reduce the height of the sealant on the second side, so that the heights of sealants formed on the first side and the second side can be approximately equal to each other.

The screen printing plate can realize the above-mentioned advantageous effects in different ways, of which some will be described in details below.

Figure 8:
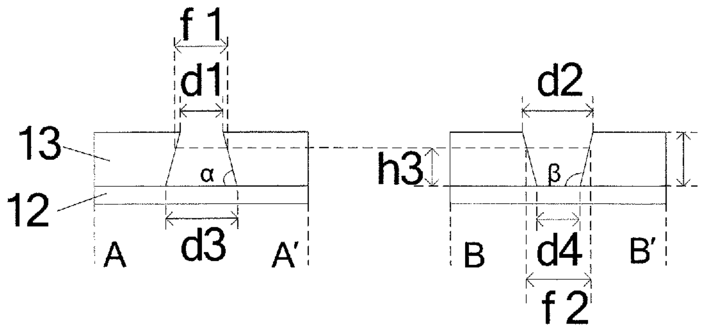
FIG. 8 is a schematic diagram of cross sections of a first side and a second side of yet another screen printing plate provided by an embodiment of the present disclosure.
Figure 9:
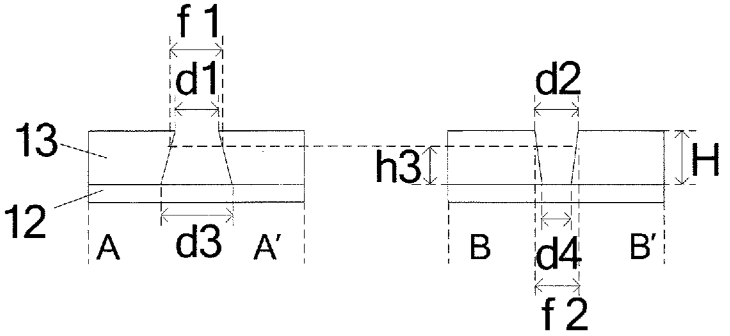
FIG. 9 is a schematic diagram of cross sections of a first side and a second side of yet another screen printing plate provided by an embodiment of the present disclosure.

For example, as illustrated by FIGS. 8 and 9, the cross section (A-A') of the first side is a regular trapezoid, while the cross section (B-B') of the second side is an inverse trapezoid. The cross section being a regular trapezoid refers to that the width of the upper-opening of the cross section is less than the width of the lower-opening of the cross section, i.e., $d1<d3$; the cross section being an inverse trapezoid refers to that the width of the upper-opening of the cross section is greater than the width of the lower-opening of the cross section, i.e., $d4<d2$.

For example, as illustrated by FIG. 8, the width of the upper-opening of the cross section (A-A') of the first side is equal to the width of the lower-opening of the cross section (B-B') of the second side, i.e., $d1=d4$; and greater than the width of the lower-opening of the cross section of the first side, i.e., $d1<d3$; the width of the lower-opening of the cross section of the first side is equal to the width of the upper-opening of the cross section of the second side, i.e. $d3=d2$. At the first height h3, an area S1 of the cross section (A-A') of the first side, i.e., an area of the regular trapezoid in FIG. 8, satisfies an equation: $S1=(d3+f1)\times h3\div 2$, where d3 is the lower base of the regular trapezoid and f1 is the upper base of the regular trapezoid, and h3 is the height of the regular trapezoid. At the first height h3, the area S2 of the cross section (B-B') of the second side, i.e., an area of the inverse trapezoid in FIG. 8, satisfies an equation $S2=(d4+f2)\times h3\div 2$, where d4 is the lower base of the inverse trapezoid, f2 is an upper base of the inverse trapezoid, and h3 is the height of the shadow trapezoid. Since $d3=d2$, $d3>f1>d1$, $d1=d4$, and $f2>d4$, then $d3>f2$, $f1>d4$, and $(d3+f1)>(d4+f2)$, i.e., $S1>S2$, the first height h3 being less than the thickness H of the film.

Or, as illustrated by FIG. 9, the width of the upper-opening of the cross section (A-A') of the first side is equal to the width of the upper-opening of the cross section (B-B') of the second side, i.e., $d1=d2$; and the width of the lower-opening of the cross section of the first side is greater than the width of the lower-opening of the cross section of the second side, i.e. $d3>d4$. At the first height h3, the area S1 of the cross section (A-A') of the first side, i.e., the area of the regular trapezoid in FIG. 8, satisfies an equation: $S1=(d3+f1)\times h3\div 2$, where d3 is the lower base of the regular trapezoid, f1 is the upper base of the regular trapezoid, and h3 is the height of the regular trapezoid. At the first height h3, the area S2 of the cross section (B-B') of the second side, i.e., the area of the inverse trapezoid in FIG. 8, satisfies an equation: $S2=(d4+f2)\times h3\div 2$, where d4 is the lower base of the inverse trapezoid, f2 is the upper base of the inverse trapezoid, and h3 is the height of the inverse trapezoid. Since $d1=d2$, $d3>f1>d1$, and $d2>f2>d4$, then $f1>d4$, $d3>f2$, i.e., $S1>S2$, the first height h3 being less than the thickness H of the film.

For example, as illustrated in FIG. 6, in a case where the width of the upper-opening of the cross section (A-A') of the first side is equal to the width of the upper-opening of the cross section (B-B') of the second side (i.e., $d1=d2$), the cross section (A-A') of the first side is a regular trapezoid, while the cross section (B-B') of the second side is a rectangle.

Figure 10:
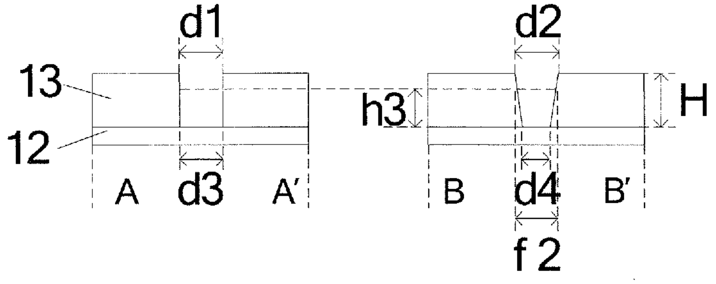
FIG. 10 is a schematic diagram of cross sections of a first side and a second side of yet another screen printing plate provided by an embodiment of the present disclosure.

Or, as illustrated by FIG. 10, in a case where the width of the upper-opening of the cross section of the first side (A-A') is equal to the width of the upper-opening of the cross section of the second side (i.e., $d1=d2$), the cross section of the first side (A-A') is a rectangle, while the cross section of the second side (B-B') is an inverse trapezoid. At the first height h3, an area S1 of the cross section (A-A') of the first side, i.e., an area of the rectangle in FIG. 10, satisfies an equation: $S1=d3\times h3$, where d3 is the length of the rectangle, and h3 is the height of the rectangle. At the first height h3, the area S2 of the cross section (B-B') of the second side, i.e., the area of the inverse trapezoid in FIG. 10, satisfies an equation: $S2=(d4+f2)\times h3\div 2$, where d4 is the lower base of the rectangle, f2 is the upper base of the inverse trapezoid, and h3 is the height of the inverse trapezoid. Because $d1=d2=d3$, and $d2>f2>d4$, then $d3>f2$, and $d3>d4$, i.e., $S1>S2$, the first height h3 being less than the thickness H of the film.

Optionally, at least one side edge of the cross section of the first side is ladder-shaped; and/or at least one side edge of the cross section of the second side is a ladder-shaped. Or, two side edges of the cross section of the first side are symmetrically ladder-shaped; and/or, two side edges of the cross section of the second side are symmetrically ladder-shaped.

Figure 11:
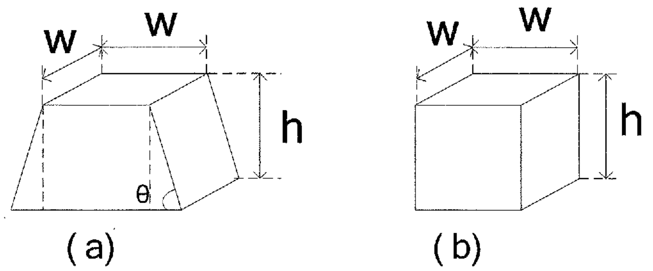
FIG. 11 is a schematic diagram of sealant at a unit length formed by the screen printing plate illustrated in FIG. 6.
Figure 12:
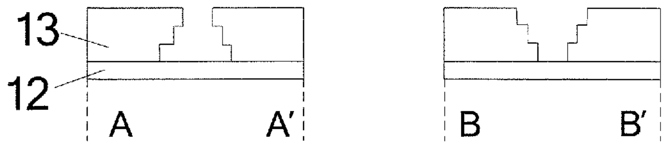
FIG. 12 is a schematic diagram of cross sections of a first side and a second side of yet another screen printing plate provided by an embodiment of the present disclosure.

As illustrated by FIG. 11, the two side edges of the cross section (A-A') of the first side are symmetrically ladder-shaped, and the two side edges of the cross section (B-B') of the second side are symmetrically ladder-shaped.

And further, for example, as illustrated by FIG. 6, in a case where the width of the upper-opening of the cross section of the first side (A-A') is equal to the width of the upper-opening of the cross section of the second side (B-B') (i.e., $d1=d2$), the cross section of the first side (A-A') is a regular isosceles trapezoid, and in a case where the cross section of the second side is a rectangle, an included angle formed by a waist side of the regular isosceles trapezoid and the lower base of the regular isosceles trapezoid is in a range from 2° to 19°.

In combination with FIG. 11, a relationship between the included angle formed by the waist side of the regular isosceles trapezoid and the lower base of the regular isosceles trapezoid and the feed quantity will be described in details.

With reference to the techniques of FIG. 1 to FIG. 4, in a case where both the cross sections of the first side and the second side are rectangles, the inventor found that the first sealant 311 is about 1.0-2.0 μm higher than the second sealant 312, i.e., $h1-h2=a=(1.0\text{-}2.0)$ μm.

In the embodiment of the present disclosure, take what is illustrated by FIG. 6 as an example, the cross section of the first side is a trapezoid and the formed sealant is trapezoid-shaped, then the first side includes a quadrangular frustum pyramid with N unit length, as illustrated by FIG. 11(*a*). The cross section of the second side is a rectangle and the second side includes a cuboid with M unit length, as illustrated by FIG. 11(*b*). The unit length can be determined as needed.

Given d1=d4=d2=w, then in a case where the unit length is w, at the unit length, a volume of the sealant formed on the first side is greater than a volume of the sealant formed on the second side by V, and given the current first sealant is a μm higher than the second sealant, then:

$$V=w*w*a=\frac{1}{2}(h*h*\cot\theta)*2w;$$

So it is obtained from the above formula that:

$$\cot\theta=\frac{wa}{h^2},$$

where the value range of a is 1.0-2.0 μm. In a case where w and the height h are certain, the value range of θ can be obtained via calculation. In an embodiment of the present disclosure, exemplarily, the value range of the height h is 2-8 μm, the value range of w is 50 μm, then the value range of θ can be obtained as 2°-19° in accordance with the above formula.

Moreover, a relative angle relationship between the first side and the second side in cases of different shapes of the cross section can be obtained in accordance with the above principles, by using the upper-opening width and lower-opening width of the first side cross section, the upper-opening width and lower-opening width of the second side cross section, and the sealant height, in combination with the height difference between the first sealant and the second sealant in the art. The embodiments of the present disclosure are described by taking the above-mentioned as an example, but not limited thereto.

The embodiments of the present disclosure provide a screen printing plate and a sealant printing method. Being parallel to the second side, the squeegee passes the two second sides in sequence to coat the sealant, so the sealant on the second side bears greater pressure from the squeegee than the sealant on the first side. In a case where the width of the upper-opening of the cross section of the first side is equal to the width of the upper-opening of the cross section of the second side, and since at the first height, the area of the cross section of the first side is greater than the area of the cross section of the second side, in one aspect, in a case where the areas of the cross sections are equal to each other, the height of the cross section of the first side is less than the height of the cross section of the second side; in another aspect, the sealant on the first side bears greater pressure from the squeegee than the sealant on the second side. By the two factors, the disclosure as compared with the prior art can reduce the height of the sealant on the second side, so that the heights of sealants formed on the first side and second side can be approximately equal to each other. Or, in a case where the width of the upper-opening of the cross section of the first side is less than the width of the upper-opening of the cross section of the section side, the feed quantity of the sealant on the first side is reduced, in yet another aspect. By the three factors, the disclosure as compared with the prior art can reduce the height of the sealant on the second side, so that the heights of sealants formed on the first side and second side can be approximately equal to each other.

The described above are only exemplary embodiments of the present disclosure, and the present disclosure is not intended to be limited thereto. For one of ordinary skill in the art, various changes and alternations may be made without departing from the technical scope of the present disclosure, and all of these changes and alternations shall fall within the scope of the present disclosure. The scope of the present disclosure is defined by the appended claims.

The present application claims priority to Chinese Patent Application No. 201510618106.2 filed on Sep. 24, 2015 and entitled "SCREEN PRINTING PLATE AND SEALANT PRINTING METHOD", the disclosure of which is incorporated herein by reference in its entirety.

What is claimed is:

1. A screen printing plate, comprising: a screen frame, a screen fixed to the screen frame and a film formed on the screen, a portion of the screen that is not covered by the film forming a feed opening in a shape of a rectangle ring, wherein the rectangle ring includes two opposite first sides and two opposite second sides; a width of an upper-opening of a cross section of the first side is less than or equal to that of the second side; and at a first height, an area of the cross section of the first side is greater than that of the second side, the first height being less than a thickness of the film.

2. The screen printing plate according to claim 1, wherein the cross section of the first side is a regular trapezoid and the cross section of the second side is an inverse trapezoid.

3. The screen printing plate according to claim 2, wherein the width of the upper-opening of the cross section of the first side is equal to a width of a lower-opening of the cross section of the second side, and a width of a lower-opening of the cross section of the first side is equal to the width of the upper-opening of the cross section of the second side.

4. The screen printing plate according to claim 3, wherein the trapezoid is an isosceles trapezoid.

5. The screen printing plate according to claim 2, wherein the trapezoid is an isosceles trapezoid.

6. The screen printing plate according to claim 5, wherein in a case where the cross section of the first side is a regular trapezoid and the cross section of the second side is a rectangular, an included angle formed by a waist side of the regular trapezoid and a lower base of the regular trapezoid is in a range from 2° to 19°.

7. The screen printing plate according to claim 1, wherein in a case where the width of the upper-opening of the cross section of the first side is equal to the width of the upper-opening of the cross section of the second side, the cross section of the first side is a regular trapezoid, and the cross section of the second side is a rectangular.

8. The screen printing plate according to claim 7, wherein the trapezoid is an isosceles trapezoid.

9. The screen printing plate according to claim 1, wherein at least one side edge of the cross section of the first side is ladder-shaped.

10. The screen printing plate according to claim 9, wherein two side edges of the cross section of the first side are symmetrically ladder-shaped.

11. The screen printing plate according to claim 10, wherein two side edges of the cross section of the second side are symmetrically ladder-shaped.

12. The screen printing plate according to claim 9, wherein at least one side edge of the cross section of the second side is ladder-shaped.

13. The screen printing plate according to claim 9, wherein two side edges of the cross section of the second side are symmetrically ladder-shaped.

14. A sealant printing method, comprising:

corresponding a feed opening of the screen printing plate according to claim 1 to a packaging region on a substrate to be printed;

placing sealant at the feed opening of the screen printing plate;

coating the sealant by using a squeegee in a direction parallel to the second side in a single pass; and separating the screen printing plate from the substrate to be printed.

15. The screen printing plate according to claim 1, wherein in a case where the width of the upper-opening of the cross section of the first side is equal to the width of the upper-opening of the cross section of the second side, the cross section of the first side is a rectangular, and the cross section of the second side is an inverse trapezoid.

16. The screen printing plate according to claim 1, wherein at least one side edge of the cross section of the second side is ladder-shaped.

* * * * *